United States Patent [19]

Kragness et al.

[11] 3,765,969

[45] Oct. 16, 1973

[54] PRECISION ETCHING OF SEMICONDUCTORS

[75] Inventors: Roger Clyde Kragness, Bethlehem; Herbert Atkin Waggener, Allentown, both of Pa.

[73] Assignee: Bell Telephone Laboratories, Incorporated, Murray Hill, N.J.

[22] Filed: July 13, 1970

[21] Appl. No.: 54,653

Related U.S. Application Data

[63] Continuation of Ser. No. 603,292, Dec. 20, 1966, abandoned.

[52] U.S. Cl. .................... 156/17, 96/36.2, 252/79.5

[51] Int. Cl. ........ H01l 7/00, G03c 5/00, C09k 3/00

[58] Field of Search ........................ 96/36.2; 156/17; 252/79.5

[56] References Cited

UNITED STATES PATENTS

| | | | |
|---|---|---|---|
| 2,690,383 | 9/1954 | Bradshaw | 156/17 |
| 2,740,699 | 4/1956 | Koury | 252/79.5 |
| 3,486,892 | 12/1969 | Rosvold | 96/36.2 |

*Primary Examiner*—David Klein
*Attorney*—W. L. Keefauver and Edwin B. Cave

[57] ABSTRACT

A method of precision etching for semiconductor device fabrication using the preferential characteristics of certain etchants for particular crystallographic planes of monocrystalline material. In particular, silicon is precisely etched by disposing etch masks on surfaces parallel to the (100) plane with the mask edges parallel to the lines of intersection of the (111) planes with the (100) plane, and using alkali hydroxide etches as well as certain organic reagents, which have substantially lower etch rates with respect to the (110) and (111) planes. Also, undercutting at intersections of the mask boundaries which expose the (110) plane is avoided by shaping the mask to compensate therefor. A suitable etchant formulation contains 50 parts by volume of water, 15 parts by volume of n-propanol and has molar concentration of hydroxide of about 5.3.

4 Claims, 14 Drawing Figures

INVENTORS R. C. KRAGNESS
H. A. WAGGENER

BY H.W. Lockhart

ATTORNEY

PRECISION ETCHING OF SEMICONDUCTORS

CROSS REFERENCE TO RELATED APPLICATIONS

This application is a continuation of our copending application, Ser. No. 603,292, filed Dec. 20, 1966 and now abandoned.

BACKGROUND OF THE INVENTION

Semiconductor devices, whether of the single element or integrated circuit type, are fabricated universally from monocrystalline material in slice form. Each slice provides a large number of devices. In both the single element and integrated device fabrication precise removal of portions of the material to separate devices or to produce isolating slots or grooves is an important aspect of the fabrication process. In particular, in such processing, it is important to remove a minimum of material under precisely controlled conditions in order to achieve high quality devices with economy and compactness.

For example, in the fabrication of certain integrated circuit semiconductor devices necessary electrical isolation between portions of the circuit within the semiconductor body is achieved by removing semiconductor material along predetermined boundaries to produce partial or complete slots in the semiconductor material. In the case of slots cut entirely through the slice the elements of the integrated circuit may be supported in a predetermined array by heavy metal leads comprising interconnecting supports or by application of insulating backing layers. In another procedure where the slots are partial, they are refilled with a suitable dielectric such as silicon dioxide, the slice is inverted and material removed from the opposite face to a depth sufficient to intersect the bottoms of the refilled slots. Examples of the foregoing types of fabrication techniques are disclosed in U.S. Pat. Nos. 3,287,612 and 3,335,338 of M. P. Lepselter and U.S. Pat. No. 3,290,753 of J. J. Chang, all assigned to the same assignee as this application.

In fabrication processes of the type referred to hereinabove it is important and advantageous to minimize the width of the isolating slots so as to increase device density, decrease overall size and thus effect economy and efficiency. In particular, it is important to minimize the width of the slot on the device side of the semiconductor slice by a technique which enables precise location of the slot boundaries on the device side. In this context, the device side of the wafer refers to the face, usually composed of an epitaxially deposited layer, in which the circuit elements are fabricated and upon which the interconnecting metal circuit pattern is formed. Typically the circuit elements are formed by oxide-masked diffusion processes and currently the effective device layer is within 0.4 or 0.5 mils of the slice face. A variety of techniques are available and have been employed to do this type of material removal in semiconductor slices. In addition to chemical etching processes, certain mechanical cutting techniques including air abrasive cutting and ultrasonic cutting are available. In the area of chemical etching the processes generally used have been of the isotropic type in which the etch rates are substantially uniform in all directions from the starting surface. As will be explained more fully hereinafter this technique does not enable the degree of control or preciseness advantageous for current semiconductor device fabrication.

Generally, in connection with this invention it will be understood that the material used is mono-crystalline and the explanation of the invention will be directed to silicon material having a face-centered, cubic crystal of the diamond lattice form. It will be understood that germanium and the Group III-Group V compound semiconductors are of the generally similar crystalline struture and the principles of the invention are thus not restricted to silicon. Specifically, in connection with this invention use is made of the known concept of anisotropic etching in which the different apparent etch rates of the various crystallographic planes or faces is utilized to achieve precise material removal. In particular it has been found first, that by orienting etch-resistant masks having rectangularly disposed boundaries on particular crystallographic planes, with the mask boundaries parallel to particular lines of intersection of crystallographic planes, etchants formulated to have etch rates appropriate to the exposed planes can produce narrow, well-defined grooves or slots to the desired depth under relatively simple processing controls. Also where certain intersections of mask edges expose another crystallographic plane having an insufficiently different etch rate from that of the primary etching face the mask shape is altered to compensate therefore to prevent undercutting of the mask.

In particular in one specific embodiment of the invention an etch mask having edges at mutual right angles is disposed on a major surface slice of semiconductor material parallel to the (100) plane. In this case, the (100) plane is the primary etching face, that is, it has the highest etch rate for the particular etchant. The orthogonally-disposed boundaries of the mask are placed parallel to the lines of intersection of the (111) planes with the primary etching plane, the (100). Then as etching proceeds downward from the primary etching plane, substantially no sideways etching against the exposed (111) face occurs inasmuch as the etchant is formulated to have a substantially zero etch rate thereon. However, at the intersections of the mask boundaries which form effective outside corners, planes are exposed which have etch rates dependent upon the etch rate of the (110) plane. This etch rate, although less than that of the (100) plane in a typical embodiment, still is significant. This results in an undercutting of the mask at these corners. Accordingly, it is in accordance with this invention also to alter the shape of the etch mask by providing enlarged corner areas of a predetermined size and shape to compensate for the undercutting incident to the above-described process.

A better understanding of the invention may be had from the following more detailed description thereof taken in connection with the drawing in which.

Figure 4:
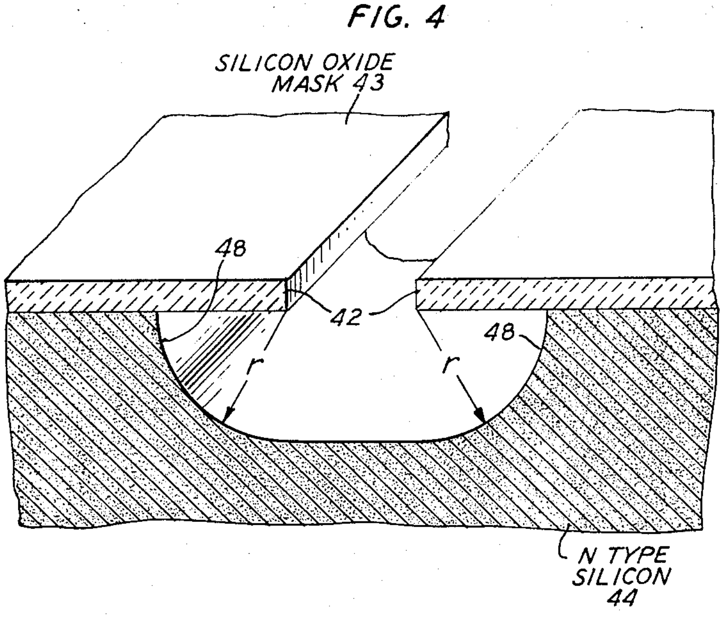
FIGS. 4 and 5 are isometric views partially in section of a slot isotropically etched in a crystal.
Figure 5:
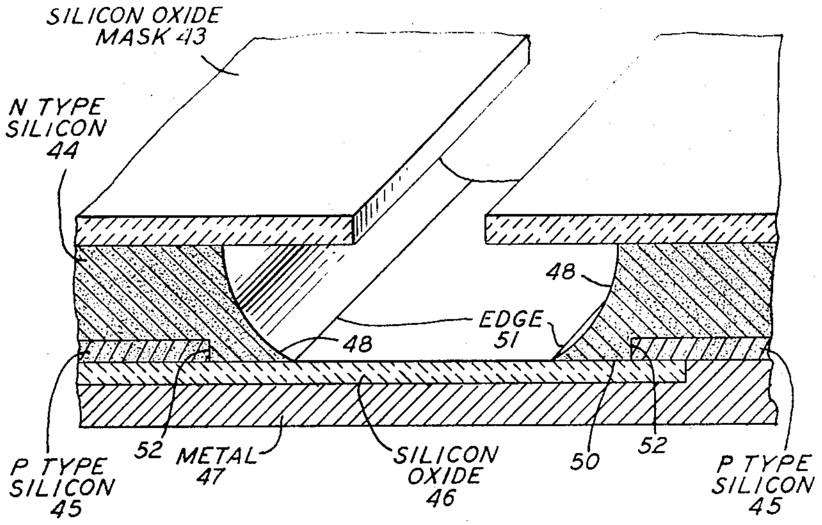
Figure 6:
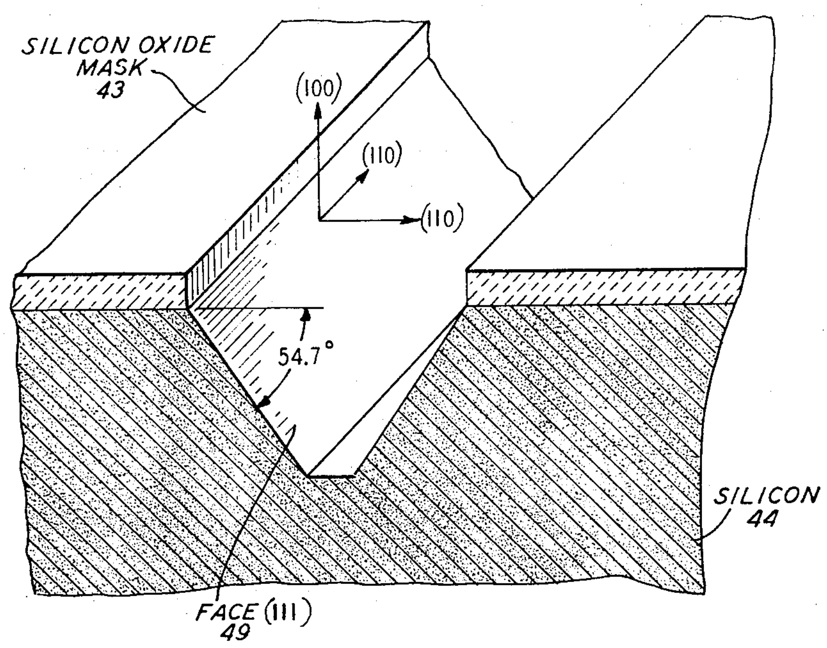
Figure 7:
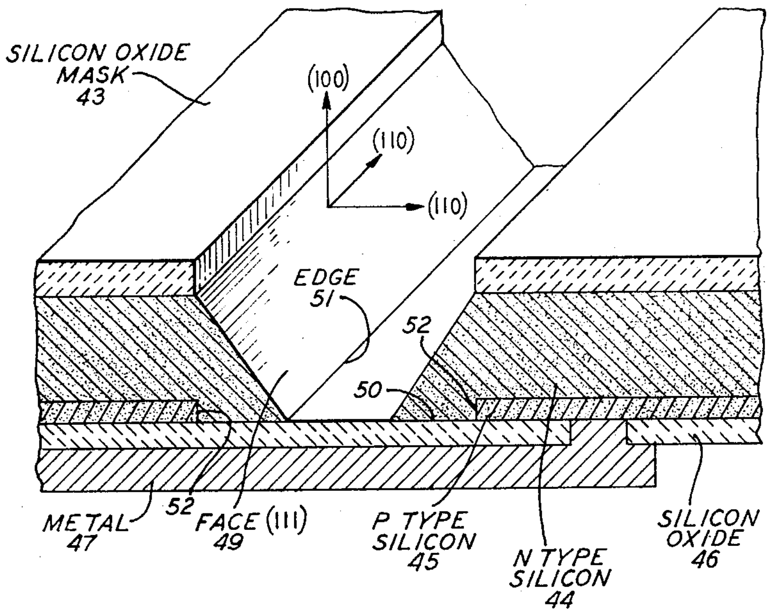
Figure 8:
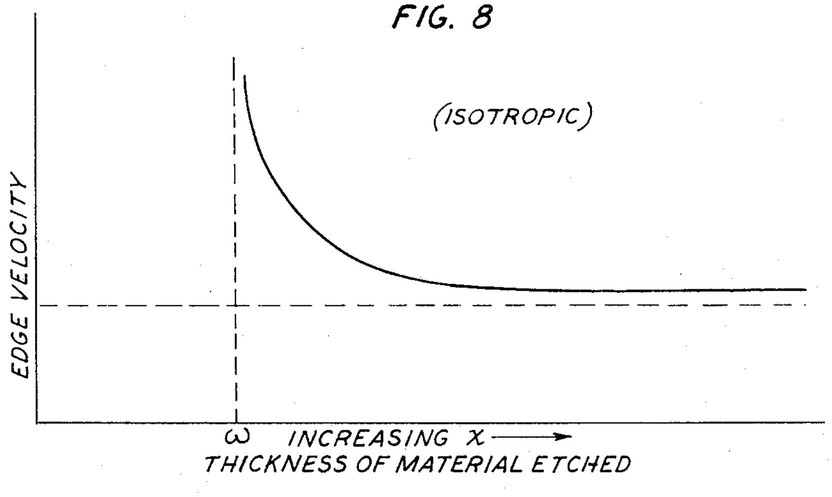
Figure 9:
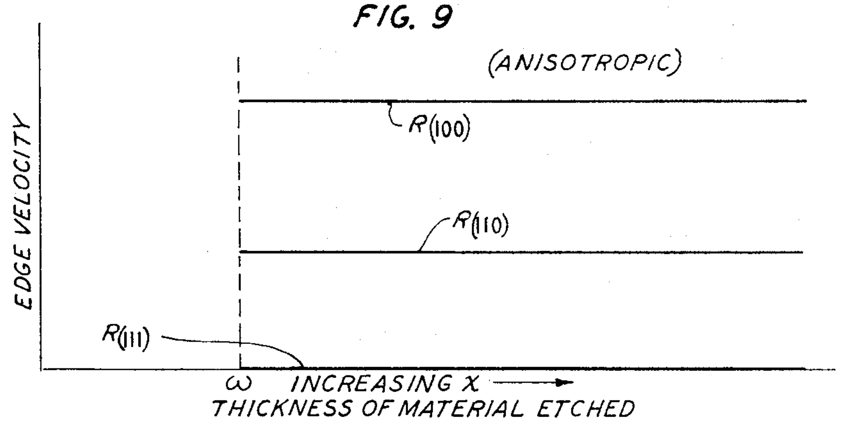
Figures 10, 11:
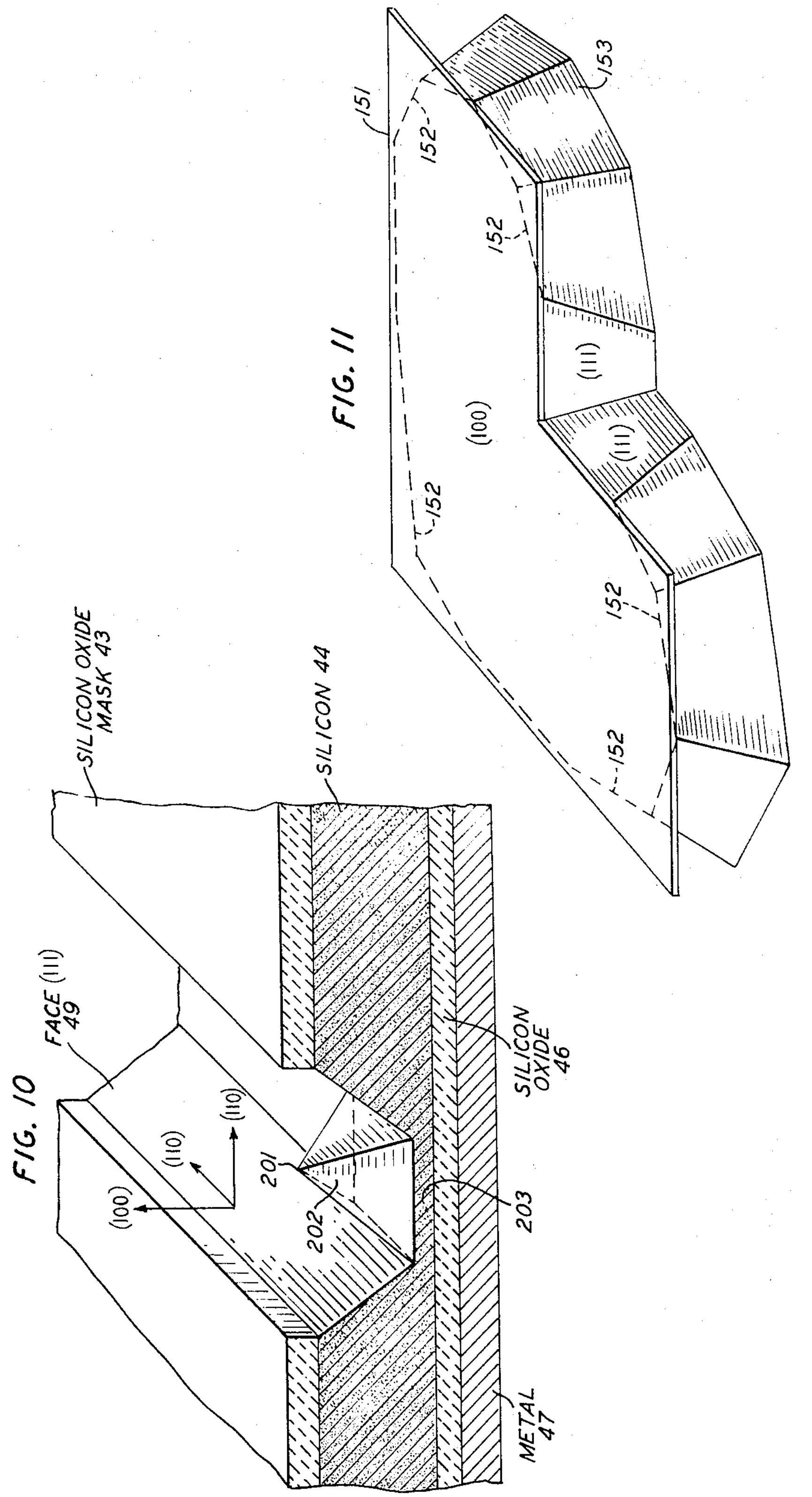
Figure 14:
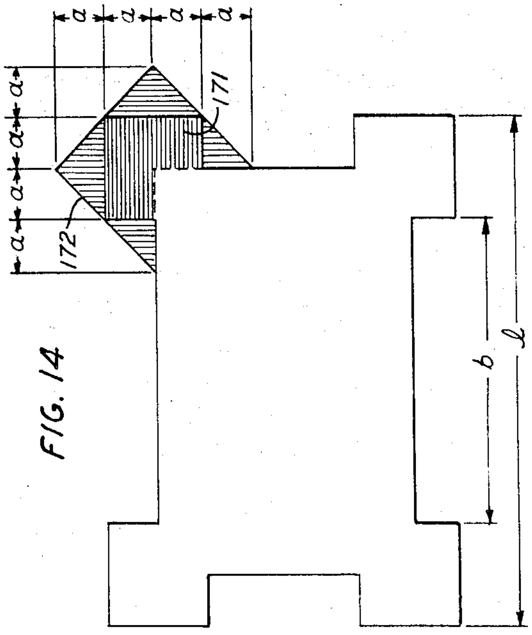
Figure 12:
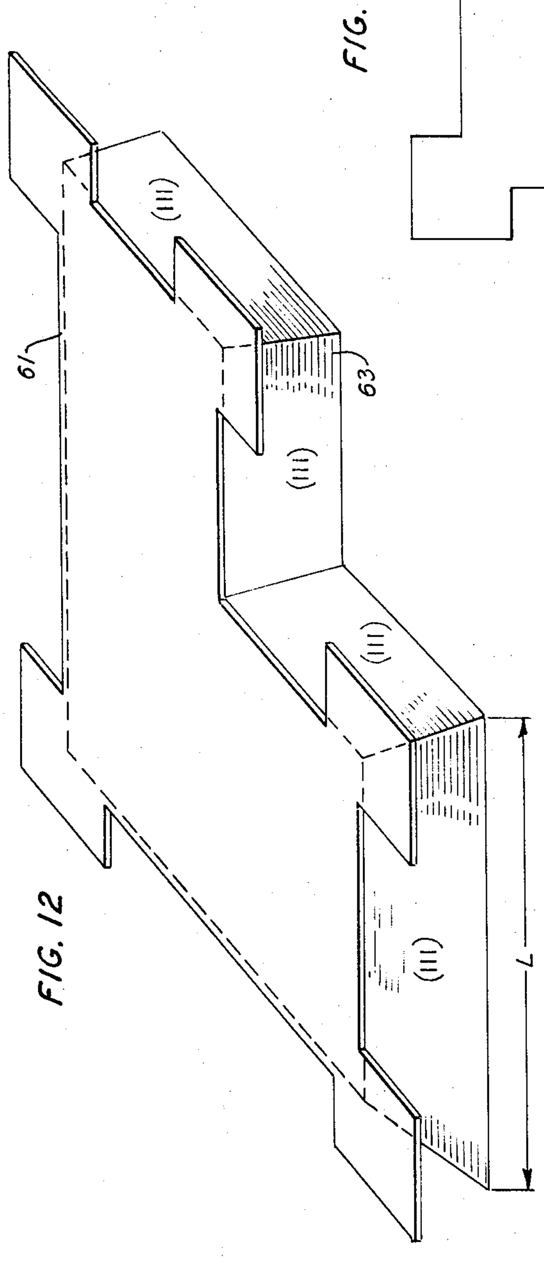
Figure 13:
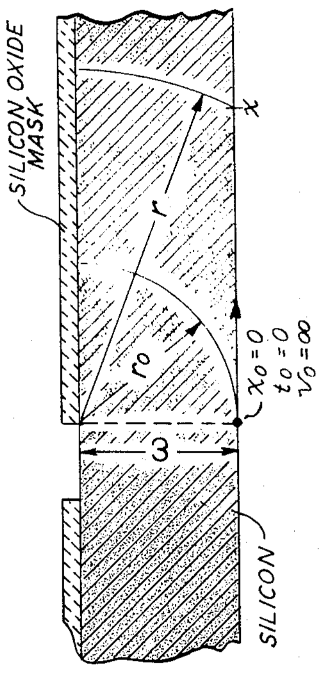

FIGS. 6 and 7 correspond to FIGS. 4 and 5 showing, howver, slots etched anisotropically in accordance with this invention;

FIGS. 8 and 9 are graphs contrasting the degree of control of etching fronts by isotropic and anisotropic etching;

FIG. 10 is another view similar to FIG. 7 illustrating the problem of "pyramid" formation;

FIGS. 11 and 12 are isometric views showing mesas etched anisotropically with an uncompensated mask shape and a compensated mask shape, respectively;

FIG. 13 is a diagram illustrating the difficulty of controlling isotropic etching; and FIG. 14 is a diagram of a mask shape illustrating limiting compensating shapes.

An important aspect of this invention is the formulation of etchants having suitably different etch rates to achieve the desired semiconductor device structures. In the more common isotropic etching of semiconductor material the etchant, for example, for silicon the usual hydrofluoric-nitric acid mixture, is not preferential to any great extent to any particular orientation. As illustrated in FIG. 4 such an etchant has substantially the same etch rate in all directions and penetrates along a curved front 48 roughly defined by radii from the edges 42 of the mask 43.

Thus, considerable undercutting of the etch mask occurs which, in itself, would be acceptable to the process. However, the isotropic nature of the etching renders precise control of its termination difficult unless considerable, almost prohibitive overetching is accepted. This effect may be understood by considering FIG. 5 in which the masked isotropic etching produces a slot entirely through the semiconductor slice 44. The etching does not remove the layer 46 of silicon oxide on the device side of the slice 44. The proximity of circuit elements is indicated by the adjoining P type conductivity zones 45. FIGS. 4, 5, 6 and 7 depict the etching of a slot of such geometry as to eliminate the effect of corners for purposes of this analysis comparing isotropic and anisotropic etching.

A factor of importance in the subject etching process is the velocity of the edge 51 of the etching front 48 at its line of intersection with the surface 50 of the device side of the slice. If this velocity is high it is difficult to terminate the etching at a desired location by a timing control. This problem is illustrated by the following relationships developed from the diagram of FIG. 13 in which:

$w$ is the slice thickness;

$x$ is the ordinate of the edge 51 formed by intersection of the etching front with the device side surface 50;

$r$ is the radius from the mask edge 42 to the etching front;

$t$ is the etching time; and $R$ is the etching rate. Then, the following relationships can be written:

$$r = Rt, \quad (1)$$

and $$dr = Rdt + tdR. \quad (2)$$

Also, $$r^2 = x^2 + w^2, \quad (3)$$

and differentiating and dividing by the term $x^2$ $$2rdr/x^2 = 2xdx/x^2 + 2wdw/x^2. \quad (4)$$

Simplifying and substituting $$rdr/r^2 - w^2 = dx/x + wdw/r^2 - w^2. \quad (5)$$

In expression (2) above, the term dt represents the time increment or degree of control timewise on the etching process. The term $dR$ represents variation in the etch rate. For the ideal case let it be assumed that both $dt$ and $dR$ are zero. Then dr becomes zero and the left-hand term of expression (5) likewise becomes zero, and the expression in absolute terms may be written:

$$|dx/x| = |wdw/r^2 - w^2| \quad (6)$$

The term $dx/x$ represents the incremental movement of the edge 51 at the slice face and desirably has a low value for good control. However, at the moment of "touch down" when the etch front 48 has just intersected the slice face 50, $r$ is approximately equal to $w$ and the right-hand term of expression (6) approaches infinity. Only when $r$ has become appreciably larger than $w$ does the value of the term become of reasonable magnitude. A qualitative representation of this change is shown in the graph of FIG. 8. As indicated by the curve, the edge velocity is extremely high when $x$ equals w, i.e., "touch down". Then, as r increases the edge velocity decreases, approaching assymptotically a constant value. Note that implicit in all of the foregoing is the recognition that the slice thickness $w$ will exhibit some variation as represented by the term $dw$. Current technology, even of the highest order, does not enable as a matter of practical economics the reduction of such variation within a slice to less than a few tenths of a mil.

Accordingly, using isotropic etching, if satisfactory control over the final location ($x$) of the etch front edge 51 is to be achieved readily, resort must be had to the portion of the curve of FIG. 8 where $x$ is appreciably large. This results in wider slots and a consequent wider spacing between the PN junctions 52 on opposite sides of the isolating slots as shown in FIG. 5.

Moreover, variation ($dw$) in slice thickness ($w$) occasions an etching tolerance to assure penetration at the thickest portions which results in considerable overetching at the thinner portions.

Figure 2:
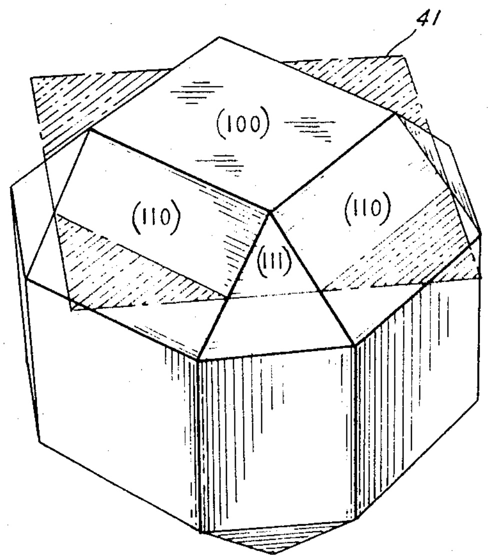
FIG. 2 is an isometric view of a crystallographic model of the silicon crystal.

Referring to FIGS. 6, 7, and 9, the use of anisotropic etching in accordance with this invention to overcome this problem is illustrated. It is known that certain chemical etchants have preferential etch rates with respect to certain crystallographic orientations. In accordance with this invention it has been found practicable to produce formulations suitable for the particular semiconductor material and desired shapes. FIG. 2 shows a model of the silicon cubic crystal representing the three crystallographic main planes of interest, namely, the (100), the (110), and the (111) planes. These designations are in accordance with the Miller indices, and in this disclosure the notation system indicates an individual plane or sets of equivalent planes. The significance of these planes, termed low-order, and their unique characteristics relative to certain processes are known in the crystallographic art. Single crystal semiconductor material in ingot form may have any one of the foregoing three crystallographic orientations. Accordingly, semiconductor slices cut transversely from such monocrystalline ingots may have major surfaces composed of any one of the three planes, namely (100), (110) and (111).

In accordance with a preferred embodiment of this invention it has been found advantageous to provide single crystal silicon slices having major surfaces parallel to the (100) plane. The etchants of primary interest in connection with this embodiment, which are the alkali hydroxides, have a high etch rate on the (100) face and their lowest etch rate with respect to the (111) face. If a limited area on the (100) face is exposed to the etchant, attack will proceed downward parallel to the (100) face at a high rate, but sideways against the (111) faces at a very low rate, which may be substantially zero. The other planes of interest, the (110), may have an etch rate less than or comparable to that of the (100) plane.

In FIG. 2 a portion of a (100) plane is indicated by the phantom outline 41. This outline 41 may be visualized as slicing through the crystal below, but parallel to, the (100) plane which is indicated as the top surface of the crystal model. The boundaries of the plane outline 41 are parallel to the lines of intersection of the (111) planes with the (100) plane.

Figure 3:
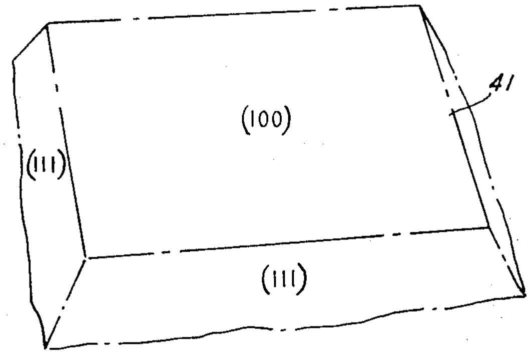
FIG. 3 is a partial isometric view of particular crystallographic planes based on portions of the model of FIG. 2 to illustrate etch mask orientation in accordance with this invention.

In FIG. 3 the plane outline 41 has been set apart and shown with portions of the adjoining (111) planes to indicate an idealized mesa configuration assumed by the semiconductor material when it is anisotropically etched in accordance with this invention.

In FIG. 6, a mask 43 is shown on the (100) face of a silicon crystal 44, and a slot has been etched downward from the exposed portion of that face, exposing as the sides 49 of the slot, (111) crystallographic surfaces defined by the boundaries of the mask. As indicated previously, the (111) planes etch at a substantially zero rate. The slope of the sidewall forms an angle with the slice surface determined by the crystallographic strucutre. The value of the angle is expressed by the term arc tan $\sqrt{2}$ and equals about 54.7°. Accordingly, it will be seen that etching proceeds downward at the floor of a slot of diminishing width, at a constant rate determined by the etch rate of the (100) plane, rather than in the manner shown in FIGS. 4 and 5 for isotropic etching.

The advantage of this anisotropic etching may be appreciated by comparing the arrangement of FIG. 7 with that of FIG. 5, both of which show the etching of a slot through a slice.

The difficulties of controlling the location of the edge 51 of the etch front in the isotropic process have been described in connection with FIG. 5 and FIG. 8. In the anisotropic process of FIG. 7 the edge 51 of the etch front at the moment of "touchdown" has a component of velocity in the *x* direction, along the slice surafce 50 of zero. At this moment, etching has terminated inasmuch as only the (111) faces are exposed, upon which the etch rate is substantially zero. Thus, the point of "touchdown" is fixed precisely by location of the mask edge on the back surface of the slice and the silicon thickness. In this arrangement, there is no danger of overetching and no need for tolerance in etching time despite thickness variations in the slice. Thickness variations require only a slight departure from the nominal slot width to assure penetration at all etching locations.

FIG. 9 is a graph for the anisotropic process corresponding to that of FIG. 8 for the isotropic case showing curves of edge velocity for the etch rate of the crystallographic planes of interest. For the anisotropic case the edge velocity is a constant represented by a straight line at the level corresponding to the etch rate of the respective plane. Accordingly, with the avoidance of the problem of overetching which exists in the isotropic technique, the anisotropic process enables a considerably closer spacing of PN junctions 52 adjoining the slots on the device side.

The alkali hydroxide etchants which are of interest in connection with this embodiment of the invention are selective not only with respect to crystallographic orientations of silicon monocrystalline material but also with respect to the silidon oxide. Thus, silicon oxide is a standard masking material and is formed in a mask shape by well-known photolithographic techniques. Moreover, in many semiconductor integrated circuits, in particular those of the air isolation type referred to above, layers of silicon oxide exist particularly on the device face of the circuit and accordingly, the etching process does not include the removal of such films.

Thus in accordance with one embodiment of this invention, anisotropic etching under relatively precise control is achieved on monocrystalline silicon material by aligning etch mask patterns parallel to the (100) plane and with the edges of the mask at mutual right angles and parallel to the intersection of the (111) planes with the (100) planes. This is an ideal configuration if the etchant employed has a high etch rate with respect to the (100) plane and a substantially zero etch rate with respect to the other two planes, (110) and (111). However, it has been found that local perturbations or irregularities during the etching process may be sufficient to inhibit the etching process and result in the formation of pyramids having their apexes at the perturbation or irregularity. This effect is observed, for example where a polished surface has been scratched and etched. It can be appreciated that a sufficient number of such pyramids can result in substantial termination of the etching process against the (100) plane when the sides of the pyramids intersect.

FIG. 10 illustrates the effect of pyramid formation. Starting from some irregularity at the apex 201, the pyramid 202 has grown as the etching proceeds until its sides intersect the (111) plane at the slot walls 49 leaving a portion 203 to bridge the slot.

In order to preclude the formation of such pyramids the etchant is formulated so as to provide an etch rate with respect to the (110) plane which is intermediate that of the (111) and (100) planes. This results in a sufficient etching so as to remove pyramids.

However, if the etchant is formulated to have this higher etch rate with respect to the (110) planes, reference to FIG. 11 will illustrate a consequent deleterious effect at the outside corners where the (111) planes intersect.

FIGS. 12 and 14 show a technique of mask compensation to overcome this effect, and shou,d be considered also in connection with the following explanation.

FIG. 11 shows an etch mask 151 on a portion of the crystal 153 being etched. At the outside intersections of the (111) planes an undercutting of the maks 151 occurs as indicated by the broken lines 152. This undercutting is related to the etching of (110) planes. Thus there is a departure from the mask outline 151 as represented by the broken lines 152 at each of the outside corners of the crystal. Such a result, of course, is undesirable inasmuch as the most useful device geometry is a rectangle or series of rectangles.

This effect can be compensated for, and thus the rectangular geometry can be approximately achieved, by the use of a compensating form in the mask at the corners. This form can take many shapes, one of which is shown in FIG. 12. In FIG. 12 the sides of the compensating form are parallel to the intersections of the (111) planes and the starting (100) plane. The important consideration with respect to the compensating form to closely achieve the rectangular geometry is that the horizontally shaded zone 171 in FIG. 14 must be masked and no area outside the vertically and horizontally shaded regions 172 and 711 be masked. Moreover, any arbitrarily shaped form at the corners of the mask outside the confines of the starting rectangle will exhibit some degree of compensation for the etching of the corners.

To achieve the rectangular geometry, the dimension a shown in FIG. 14 should be $a \geqslant kw/2$ where $k = R_{110}/R_{100}$ $w$ = silicon thickness.

The minimum overall mask side dimension is $l_{min} = 2kw + b$ where b = the smallest nonzero definable slot that can be achieved with the masking process.

The minimum of the mesa 63 dimension on the device side is $L_{min} = \sqrt{2}w + kw + b$ silicon Although the above paragraph described corner compensation specifically for the (100) orientation, the principle of corner compensation by the judicious use of special shaped forms on the mask can be applied to other crystal orientations as well to obtain specially shaped geometries.

One particularly suitable formulation for use with monocrystalline silicon oriented as described herein comprises a solution containing 15 grams of potassium hydroxide (KOH), standard commercial grade; 50 milliliters of water; and 15 milliliters of n-propanol. This particular formulation, in which the molar concentration of the hydroxide is about 5.3, has been found to provide an etch rate with respect to the (110) plane in the range of about three-tenths to four-tenths of its etch rate relative to the (100) plane. The etch rate is affected by potentials set up within the solution. The rate of three-tenths to four-tenths mentioned above occurs for the etching of beam leaded circuit devices which include gold. The etch rate for bar silicon with no metal present is somewhat less.

In a specific embodiment using the above formulation at a temperature of about 85° C. etch rates of about 1.2 microns per minute on the (100) plane have been observed. In general other alkali hydroxides including those of sodium, cesium, lithium and rubidium may likewise be employed. These various hydroxides differ primarily in the rate at which they etch silicon oxide. The rate of attack of any of this class of etchants on silicon oxide may be reduced for example by the controlled addition of aluminum. The etch rate on the (110) plane may be effected by altering the by product content of the etching solution and by the inclusion of low order alcohols such as methanol and ethanol. In particular, silicates which result from the etching process tend to increase the (110) etch rate. Other suitable etchants may be formulated using organic reagents capable of producing free hydroxide ions, including amines such as ethylene diamine with water.

In a particular embodiment in accordance with the invention a slice of silicon semiconductor material is prepared in accordance with the teachings of the aforementioned patents of M. P. Lepselter to the end of fabricating the air isolated monolith or isolith illustrated in FIG. 1. For this purpose a slice is prepared, is subjected to one or more masked solid state diffusion treatments to produce, from one face of the body, circuit components which may include transistors, diodes, and resistors. Metal beam lead contacts likewise are formed on one face of the slice and it is finally prepared for the final separation process in accordance with this invention.

For this purpose the slice is mounted beam lead face down using a suitable resistant material, and typically is thinned from a thickness of about five mils to about two or three mils. The surface then is coated with a film of silicon oxide which is to be used as the back etch mask.

It will be appreciated that the semiconductor slice at this point will be deleteriously affected by exposure to elevated temperatures associated with the thermal formation of silicon oxide film. Accordingly, it is important, in connection with this aspect of the invention to form an intimate, adherent oxide layer by a comparatively low temperature process. In particular, it is important to prevent the formation of any intervening layers of fast etching materials which would result in separation of the mask layer from the silicon.

One technique for achieving a satisfactory silicon oxide layer on the back surface of the slice includes a first step of anodic oxidation to form a relatively thin layer of silicon oxide. Such a process is disclosed, for example, in the application of P. F. Schmidt, Ser. No. 549,338, filed May 11, 1966, now U.S. Pat. No. 3,438,873. The anodically formed oxide surface then is vacuum back-sputtered to clean it and then, in situ, is subjected to an electron beam evaporation process to form an oxide layer of from about 6,000 to 10,000 Angstroms thickness, or sufficient to match the etching time.

Figure 1:
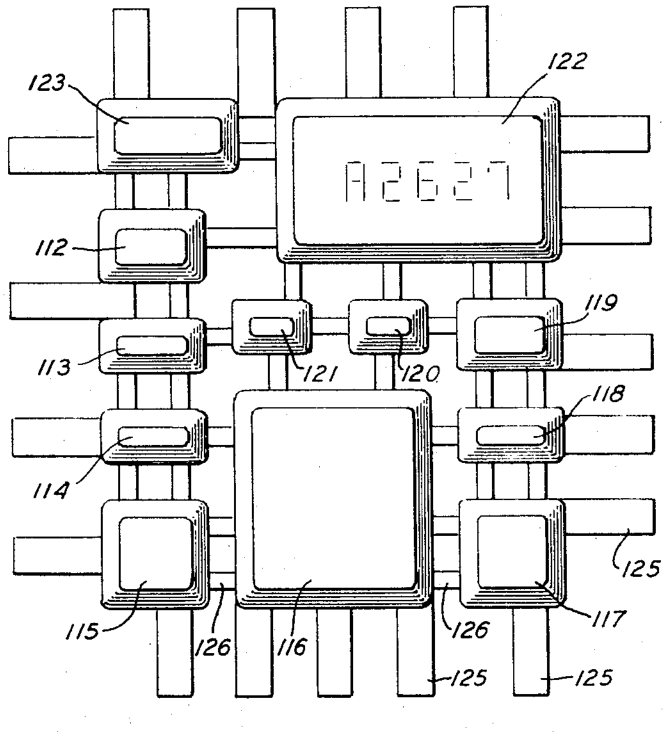
FIG. 1 is a plan view of an air-isolated monolith (AIM) integrated semiconductor device including beam leads and illustrating a device fabricated using the etching processes in accordance with this invention to produce isolation.

As a next step the photolithographic mask is formed on the oxide surface aligning the boundaries of the mask with the (111) plane intersections as set forth above. Suitable crystallographic techniques including goniometric methods may be used to determine crystal orientations and the material suitably identified such as by the formation of a flat on the ingot. After the pattern has been developed in th photoresist, standard oxide etchant, such as buffered hydrofluoric acid and water solution, is used to remove the unmasked silicon oxide. Finally the slice is immersed in the alkali hydroxide etchant and anisotropically etched to produce the precise separations between portions as illustrated in the array of FIG. 1. The rectangular wafers 112 through 123 are the isolated portions of the circuit. Each such wafer may contain one or more circuit elements. The structure is supported in the array shown by the plurality of beam leads 126, with a similar type of beam lead 125 providing means for external connection. The pyramidal sides of the various portions of the circuit device as viewed from the back etching face indicate the anisotropic form of the etching process.

As suggested hereinafter the anisotropic technique disclosed herein may be applied also to a process in which it is desired to cut only to a predetermined depth within the material rather than entirely through the material. Such techniques are useful in processes such as that disclosed in the aforementioned Chang patent, which has been termed an EPIC process. For such an EPIC process the practice of this invention is simplified to the extent that a suitable thermal oxide film is usually available inasmuch as the slot cutting is one of the initial steps in the fabrication.

The anisotropic etching technique provides a simple way of producing identification numbers as shown in the wafer 122 of FIG. 1. Such figures are composed of unconnected slots, thus eliminating corner effects and rendering the process self-terminating at a depth fixed by the slot width. It is important, of course, to preclude etching through the slice by using too wide a slot for this purpose.

Moreover, although the process has been desicrbed thus far in terms of a shaping technique in which one of the low order crystallographic planes has an etch rate of substantially zero, it will be understood that shaping may be accomplished controllably if that rate is sufficiently lower than that of the other two planes. Such a system, although useful, will not be as advantageous from the standpoint of self-terminating characteristics. Also, in addition to the use of silicon oxide as a mask, certain other materials have been found useful as masks including other dielectrics, such as silicon nitride.

The foregoing disclosure also has been in terms of the treatment of monocrystalline silicon semiconductor material. It will be apparent to those skilled in the art that these procedures generally may be applied to other monocrystalline semiconductor material of similar crystallographic structure, including, germanium as well as the well-known Group III-Group V compound semiconductors. The etchant formulations will vary for these various materials. However, in accordance with this invention precise etching is achieved by recognizing and using the differing etch rates existing among the three low order crystallographic planes characteristic of these materials.

In connection with such procedures in the compound semiconductors, it will be appreciated that a different etching response occurs depending upon which of the two elements of the compound predominate in that particular surface. Specifically, for example, in the case of a gallium arsenide crystal, and referring to the model of FIG. 4 the (111) plane shown at the center of the model may exhibit a predominance of gallium atoms. On the other hand the inversion of this (111) plane which exists at the opposite lower side of the model will exhibit a predominance of arsenic atoms. Accordingly, etchants may be formulated to take advantage of not only the primary crystallographic orientation, but, in the case of compound semiconductors, the factor of which of the inversions is exposed.

Etchants may be formulated, which attack the (110) plane at a rate comparable to the etch rate of the (100) plane. For such an arrangement, in which the (110) plane is the primary etching plane, the mask edges are placed parallel to the intersections with the (110) plane of the various (111) and (110) planes. The mask edges then are not necessarily at mutual right angles and different mesa configurations are generated by the etching process. It is important to consider the geometric efficiency of the shapes generated from the standpoint of device compactness.

In any system the considerations for achieving precision etching remain the relative etch rates between three low order crystallographic planes for a given etchant, and the configuring of the corners of the etch mask so as to avoid the interference effects of perturbations and irregularities and the consequent undercutting at corners occasioned by adjustment of the intermediate etch rate to avoid pyramiding.

Accordingly, it will be understood that departures from the foregoing specific teachings may be made by those skilled in the art which however will still come within the scope and spirit of the invention. For example, it will be apparent to those skilled in the crystallographic art that systems of planes other than those of the lowest order may be used.

What is claimed is:

1. The process of shaping by anisotropic chemical etching a monocrystalline slice of silicon semiconductor material having as low order crystallographic planes the (100), (111) and (110), said plane having its two major surfaces in said (100) plane, forming an etch resistant mask of silicon oxide on one of said major surfaces, the edges of said mask being parallel to the lines of intersection between the (100) plane and the (111) plane, applying an etchant comprising a solution of an hydroxide selected from the group consisting of potassium, sodium, cesium, lithium and rubidium, water and n-propanol having the relative proportions of 50 milliliters of water, 15 milliliters of n-propanol, and a molar concentration of hydroxide of about 5.3, said solution being applied to said masked slice at a temperature of about 85°C.

2. The process in accordance with claim 1 in which the adjoining edges of said etch resistant mask defining unmasked portions of said slice surface have a width sufficient to enable penetration by the etching process through the silicon slice, said etching process being self-terminating.

3. The process in accordance with claim 1 in which the mask is shaped to a compensating form at its outside corners.

4. The process of shaping by anisotropic chemical etching a monocrystalline slice of silicon semiconductor material having as low order crystallographic planes the (100), (111) and (110), said slice having its two major surfaces in said (100) plane, forming an etch resistant mask of silicon oxide on one of said major surfaces, the edges of said mask being parallel to the lines of intersection between the (100) and the (111) plane, applying an etchant comprising a solution of potassium hydroxide, water, and n-propanol having the relative proportions of about 15 grams of potassium hydroxide, 50 milliliters of water and 15 milliliters of n-propanol, corresponding to molar concentration of said hydroxide of about 5.3, said solution being applied to said slice at a temperature of about 85°C.

* * * * *